United States Patent [19]

Heuer et al.

[11] 4,057,787
[45] Nov. 8, 1977

[54] READ ONLY MEMORY

[75] Inventors: Dale A. Heuer, Stewartville; John F. Roemer; Michael J. Sheehan, both of Rochester, all of Minn.

[73] Assignee: International Business Machines Corporation, Armonk, N.Y.

[21] Appl. No.: 657,796

[22] Filed: Feb. 13, 1976

Related U.S. Application Data

[63] Continuation of Ser. No. 539,904, Jan. 9, 1975, which is a continuation of Ser. No. 391,425, Aug. 23, 1973, abandoned.

[51] Int. Cl.² ............................................. G11C 11/40
[52] U.S. Cl. .............................. 365/104; 340/173 SP; 307/238; 307/279; 307/317 R; 365/183
[58] Field of Search .................... 340/173 R, 173 AM; 307/238, 279

[56] References Cited

U.S. PATENT DOCUMENTS

| | | | |
|---|---|---|---|
| 3,529,299 | 9/1970 | Chung | 340/173 R |
| 3,611,437 | 10/1971 | Varadi | 340/173 R |
| 3,614,750 | 10/1971 | Janning | 340/173 R |
| 3,728,696 | 6/1973 | Pockinghorn | 340/173 R |
| 3,744,036 | 7/1973 | Frohmann et al. | 340/173 R |

*Primary Examiner*—Terrell W. Fears
*Attorney, Agent, or Firm*—Robert W. Lahtinen

[57] ABSTRACT

An FET read only memory array having bit locations arranged in rows and columns utilizes a dynamic array and static sensing. A dynamic first address selects the gate line of a selected column and a second address selects the source line or lines to select one or more bits within the selected column. The presence or absence of a gate at a selected bit location determines whether a first or second logic level is present at the sense or drain line serving the bit location. An additional column of FET bit positions each with a gate has the gate line activated toward the conclusion of the cycle to provide a path to ground for the elimination of any charge on a sense line in preparation for the next succeeding cycle. The sensed output from a selected bit location is latched until reset.

13 Claims, 12 Drawing Figures

READ ONLY MEMORY

This is a continuation of application Ser. No. 539,904, filed Jan. 9, 1975 which is a continuation of application Ser. No. 391,425 filed Aug. 23, 1973 now abandoned.

BACKGROUND OF THE INVENTION

This invention relates generally to large scale integrated circuits and more particularly to read only memories wherein binary information is permanently stored.

A basic device for the operation of general purpose computers and the operation of processor controlled equipment where the use of permanent data is required is the read only memory (ROM). Low cost, compact read only memories have made possible the use of many devices which can utilize extensive permanent data for more effective operation, but cannot support a large overhead cost. The advent of large scale integration using field effect transistor (FET) circuitry has made permanent storage using such devices competitive with any other form of random access storage.

To achieve high density ROM design it is necessary that both the power consumption that results in heat that must be dissipated be minimized and the overhead circuits associated with the array which require space or real estate on the chip and limit compactness be eliminated. The use of dynamic circuits yield compact size hence the relative size of diffusions is not a factor and the circuitry can be designed for easy access and the elimination of DC circuits that result in heat dissipation problems. The limitation in regard to dynamic circuitry is the necessity of clocked timing circuits and interfacing with exterior static logic with which the device must be connected and interact.

The ROM of the present invention utilizes dynamic techniques for both an FET array arranged in rows and columns and the column address where a control electrode interconnects the gate elements of a column of bit positions. The array is composed of bit locations each of which is an FET device capable of indicating either a logical one or a logical zero at an output upon being addressed. A logical one occurs when effective transistor action occurs because of the presence of a thin oxide gate and a logical zero occurs when no transistor action results upon the bit location being addressed as a consequence of the absence of a thin oxide gate. Accordingly, each bit location is personalized by the presence or absence of such a gate or device. Each bit location also has two output electrodes. A source line addresses a row of devices by placing a charge at the source of each FET in a selected row. A bit position is selected by the intersection of a column or gate line and a row address or source line. If a gate is present at the bit location the charge from the source line is transferred to the sense or drain line to indicate a logical one at an associated output terminal. If a device or thin oxide gate is absent, then a logical zero is indicated. The array uses compact non-ratioed dynamic circuitry which indicates logic levels through a charge transfer without the use of DC current. The gate decode or column address circuitry is also non-ratioed dynamic circuitry having minimal space requirements. The remainder of the circuitry is composed of ratioed static circuits including the gate decode address, source address and decode circuits, chip or array address and decode circuits, the sense circuits and output latches. Each of the circuits that connect with other devices are static and therefore may interface with any static chip.

To coordinate the dynamic logic, two clock pulses are utilized. A first clock pulse $\phi X$ is utilized to time the charging of the selected gate decode line and a second clock pulse $\phi P$ serves both to ground any residual charge on an output or sense line from the previous cycle and to time the source line select for the current cycle. When an address is received by the gate decode, the previously charged gate line is grounded if the same line is not readdressed. However, it is possible for a charge to remain on the sense line from a previous cycle if provision is not made for removal of the charge from the sense line at the conclusion of the cycle or after the output has been latched. To remove any resident charge on the output line an additional column of bit positions is provided in the array each of which has a device or gate which is addressed by the clock pulse $+\phi P$ to provide a conductive path from each sense line to the associated source line while an additional FET in each source line decode circuit is also activated by clock pulse $+\phi P$ to complete the path to ground.

The output of the ROM cycle is latched when $\phi P$ again returns to a $+$ value and will remain valid while $\phi P$ continues to have a positive value. The output latches are reset by removing the positive input charge from the reset inverter while $\phi P$ continues to have a positive value. By using the techniques described above it is possible to achieve a density of 24,576 bits of read only storage along with the associated address, array select and output sensing and latching circuitry in a space less than 200 mils square.

It is an object of this invention to provide an improved high density read only memory. It is a further object of the invention to provide an increased density read only memory by optimizing placement of array elements and reducing power consumption. It is also an object of the invention to provide a read only memory that utilizes dynamic logic in the array while using static logic for addressing and sensing to enable ease of interface with static logic chips. It is also an object of the invention to provide a read only memory with means to remove any charge resident in the sense line at the end of a memory cycle.

DETAILED DESCRIPTION

Figure 1:
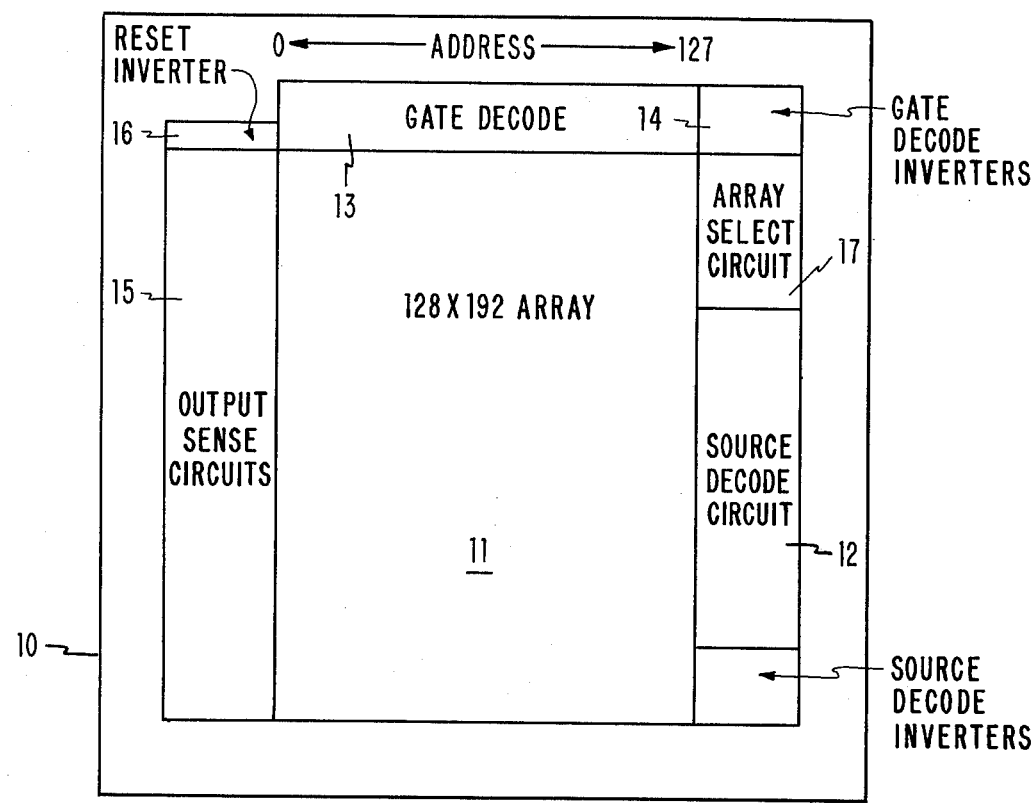
FIG. 1 is a schematic plan view of a large scale integration chip illustrating the arrangement of array, address, decode, array select and output sensing circuitry.

FIG. 1 illustrates the division of circuit regions on a large scale integration chip 10 that provides the read only memory function. The complete array 11 includes 24,576 addressable bit locations arranged in 128 vertical columns and 192 horizontal rows. The rows are selected by 96 source lines which are driven by decode circuits in region 12 and the bit location within the rows selected by one of 128 gate lines selected by decode circuits disposed in region 13. The gate decode circuits are selected by a seven bit address implemented by a series of seven double inverter circuits positioned in region 14. The presence or absence of a device is sensed on 192 sense or drain lines by a series of 16 circuits in region 15 that provide latched outputs and a reset circuit at 16 resets the output latches at the end of the cycle. One additional column in the array region 11 provides for removal of a charge transmitted to the output during a previous ROM cycle. The array is partitioned into three addressable divisions with the chip or array select circuits disposed in region 17.

Figure 2:
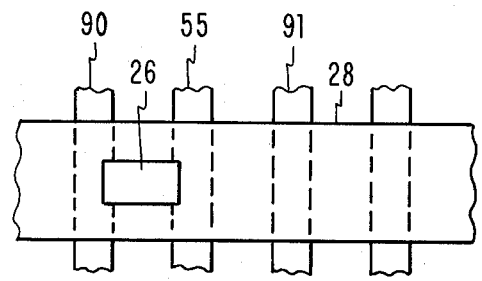
FIG. 2 is a plan view of a chip showing source and sense line diffusions and an overlying gate line including the position of a thin oxide gate device.
Figure 3:
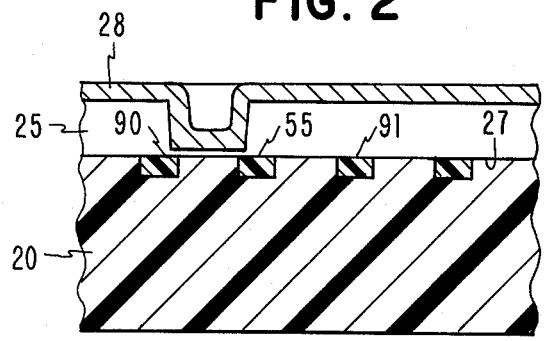
FIG. 3 is a vertical section of the chip structure of FIG. 2 taken along line 3—3 of FIG. 2.
Figure 5C:
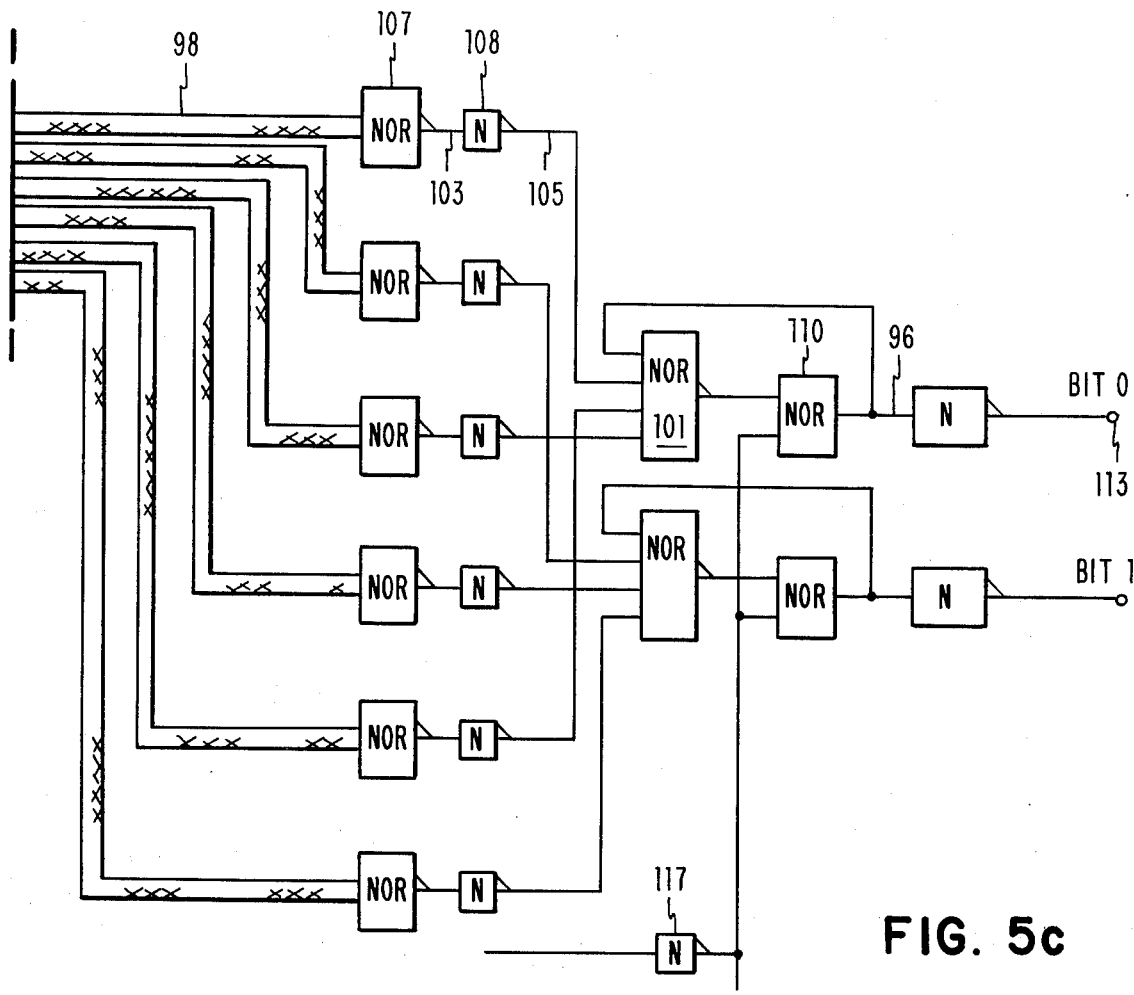
FIGS. 5A–5C when arranged from left to right as shown in FIG. 5 present a logic diagram showing the array and representative portions of addressing and output sensing circuitry.

As illustrated schematically in FIGS. 2 and 3, the chip structure is formed of a silicon substrate 20 which is doped with P type material. A diffusion pattern is formed in the upper surface of substrate 20 by selectively doping selected surface patterns to form N type regions 55, 90 and 91 in such substrate. A coating of oxide 25 overlies the substate surface. Where it is desired to have a gate or device 26 to control or vary the conductivity between adjacent diffusions a portion of the oxide layer is removed as shown at 27. A selected metal pattern 28 is then applied to the upper surface to provide a gate structure 26 where metal overlies the thin oxide layer 27 extending between adjoining diffusions such as source 55 and sense line 90. When a negative charge or no charge is applied to the metal 28, the P type region between diffusions 55 and 90 functions as an open circuit. When a plus charge is applied to the metal layer overlying the thin oxide portion 27, a negative charge is induced in the P type material intermediate diffusions 55 and 90 creating a conductive path. Accordingly, at a bit or device location when a source diffusion is charged and a positive charge is applied to the gate 26, an output charge is conducted to the sense or drain line 90.

Figure 5:
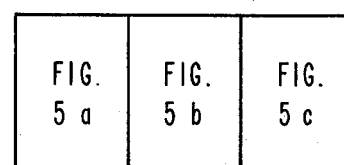
Figure 6:
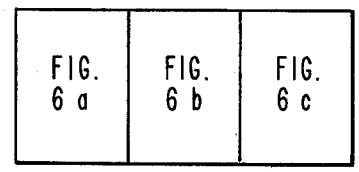
Figure 5A:
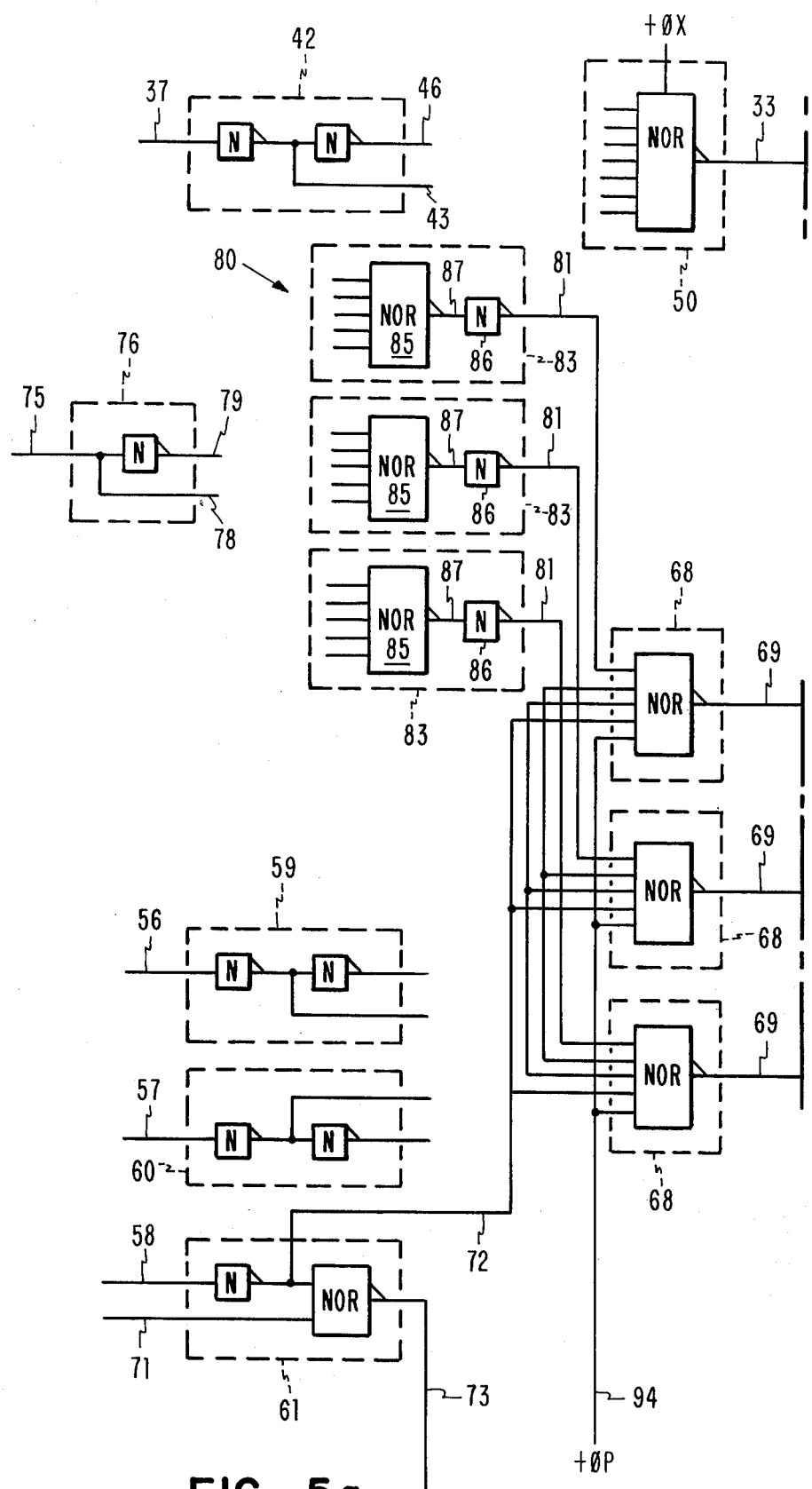
Figure 5B:
Figure 6A:
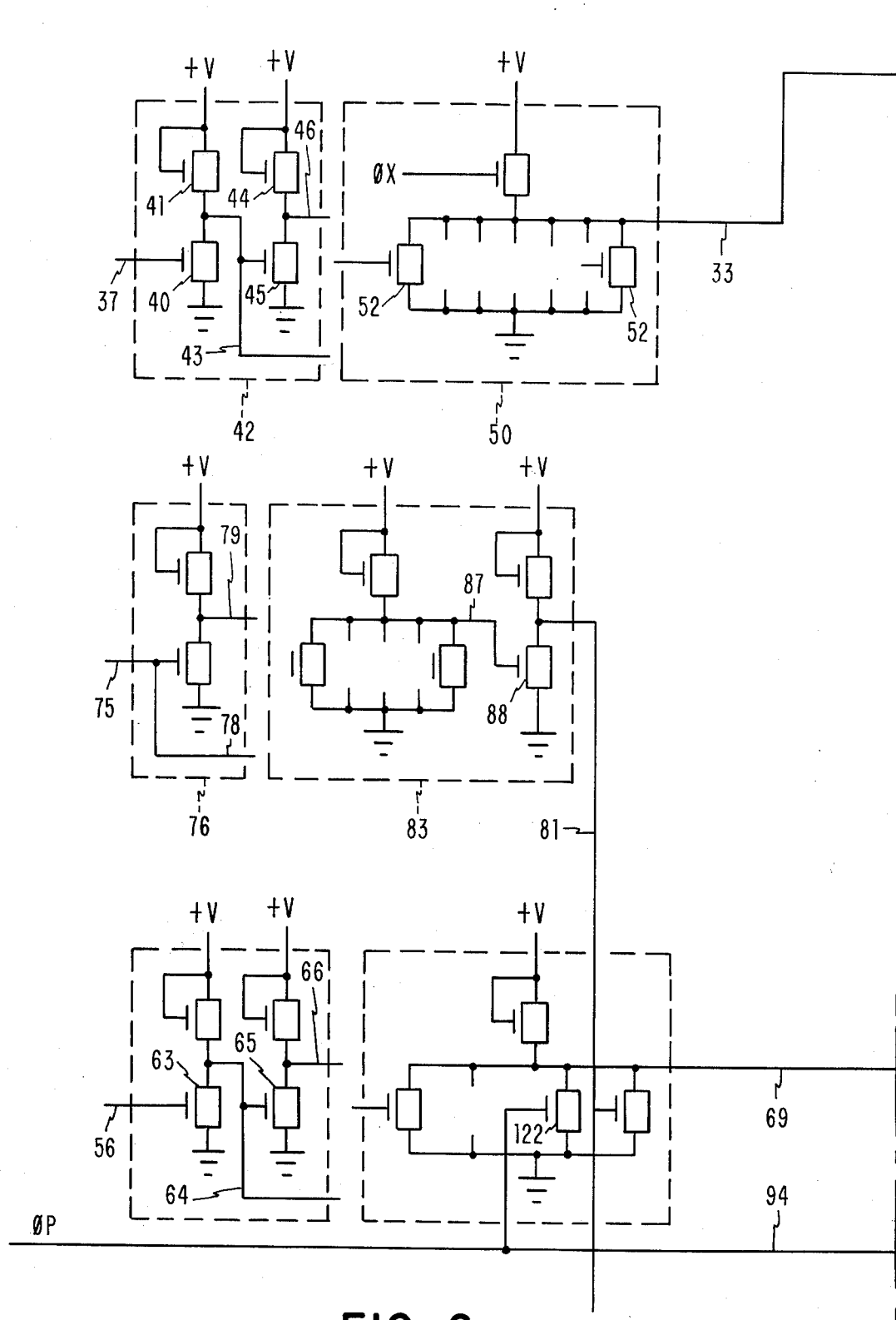
Figure 6B:
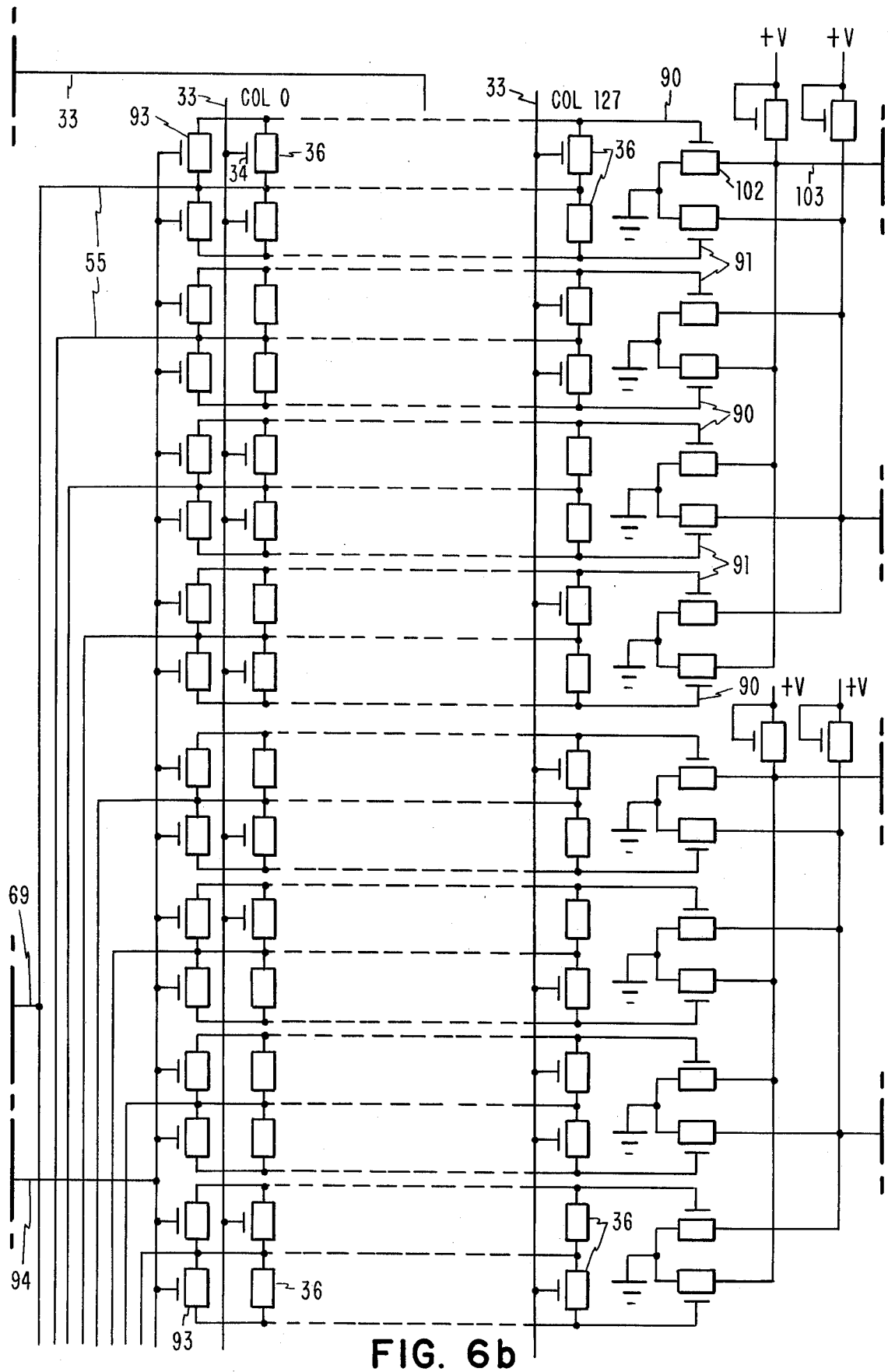

Referring to FIGS. 5 and 6, including FIGS. 5A-5C and 6A-6C, the memory array is formed of bit locations 36 disposed in 192 rows and 128 columns. The columns are addressed or selected by a series of 128 gate lines 33 which establish one of two output levels by the presence or absence of a gate 34 at the selected bit or device location 36. The gate or column select is effected by a seven bit address on seven input lines 37, one of which is shown. THe input line 37 is directed to the gate of transistor 40 of the first of a pair of inverters of gate decode inverter 42. The output of the inverter formed of transistors 40 and 41 yields the complement of the signal on line 43 and the output of the inverter formed of transistors 44 and 45 on line 46 yields the true output or the same level as the input line 37. The gate decode address lines 37 being double inverted provide buffering and the true and complement of each address. The true and complement lines of the seven gate decode inverters 42 are connected to a series of 128 gate decode circuits 50, one of which is shown. Circuits 50 are seven way binary decodes which provide 128 unique combinations of the outputs of gate decode inverters 42 such that each combination of the seven address bits on address lines 37 selects one output gate line 33. Of the 128 gate decode circuits 50, all but the selected line will have the gate at at least one of the seven transistors 52 active thereby causing all but the selected gate line 33 to have a down level.

The complete array 11 is divided into three divisions which is effected as shown in FIG. 5 each including eight segments identified as array one, array two or array three. The complete array is also organized into eight sections ech connected to two output bit positions such as bit zero and bit one. The total array is further divided into upper and lower halves including bits zero through seven and eight through 15 respectively as schematically shown in FIG. 5 to permit addressing either half of the total array with a resulting eight bit output or as will be described below, addressing both halves simultaneously to yield a 16 bit output. Each source line 55 is capable of addressing 256 bit locations within one of the eight array sections by being connected to two adjoining rows of 128 bit location FET's 36. By further selecting one of the 128 gate lines 33, two bit locations within the section are addressed. There are three source address lines 56, 57 and 58 which are double inverted to provide buffering and true and complement outputs by three source address decode inverters 59, 60 and 61. Source address decode inverter 59 is shown in FIG. 6 and inverter 60 is identical thereto. Each source decode circuit 68 drives four source lines 55.

Input line 56 is connected to the gate of transistor 63 to generate an inverted or complement output on line 64. Line 64 is also connected to the gate of transistor 65 to yield the true output upon a second inversion on the line 66. The outputs of the source address decode inverters 59 and 60 are connected to source decode circuits 68 of which there are a total of 24, each having an output line 69 that functions to select a group of four source lines 55. The third source address decode inverter 61 has two inputs on lines 58 and 71. The output line 72 is the complement of the signal on input line 58 and is supplied to the source decode NOR circuits 68 having outputs connected to the four array sections connected to output bits zero through seven while the true output on line 73 is connected to NOR circuit 68 which have outputs connected to the four array sections connected to output bits eight through 15. When it is elected to operate the total array as two halves, input line 71 is grounded. Thereupon a positive condition on line 58 causes a negative condition on output line 72 and a positive condition on output line 73 that permits selection of one of the three arrays in the upper half of the total array while a negative input on line 58 causes a positive condition on line 72 which de-selects the NOR circuit 68 associated with total array upper half and a negative condition on line 73 permitting selection of one of the three array divisions associated with the lower half of the total array 11 where that portion with outputs at bits eight through 15. When it is desired to address all eight array sections simultaneously, lines 58 and 71 are dotted together causing a positive condition on line 58 to select all eight sections and 16 output bits simultaneously.

Five chip or array select address bits on five lines 75 are respectively supplied to five inverters 76 (one of which is shown) to provide two and complement outputs on lines 78 and 79 respectively. The five bit chip select address bits or lines 75 are capable of identifying 32 unique combinations for transmission to each chip or array select NOR circuit 80 to provide an inverted output on line 81 when selection occurs. Since the five bit chip select is capable of selecting 32 combinations and only three are used for the selection of the desired one of the three array divisions, the five bit chip select address is capable of selecting arrays from 10⅔ total arrays as shown. The true and complement outputs of the five chip select input lines 75 are connected to three chip select decode circuits 83 which decode the unique five bit input combinations to select one of the three array divisions of the total array 11. Each chip select decode circuit includes a five way NOR 85 and an inverter 86. When the true and complement values of the five bit chip select address connected to one NOR 85 are all at a negative or down level, the output on line 87 connected to the gate inverter transistor 88 is at an up level causing a negative or down level on line 81. The output on each line 81 is connected to the eight source decode NOR circuits 68 associated with one of the three array divisions permitting selection of that array division.

A charge transfer to the array sense lines 90 and 91 on a previous ROM cycle can remain unless removed. To assure removal of such charges an additional column of bit locations 93 is provided with a gate or device between every source and drain or sense diffusion. All the devices in the column are turned on and a plus signal is delivered to each NOR circuit 68 by an auxiliary clock pulse, flush $\phi$P on line 94. This clock pulse occurs once each ROM cycle to ground any charge remaining on the sense lines 90 and 91 of the array 11 from the previous cycle.

There are 16 output bits, zero through 15 from the total array 11. A pair of sense lines 90 and 91 adjoins each source line 55 with the presence or absence of a device or gate at each bit or address location 36 causing charge transfer or the lack of a charge transfer to the sense lines 90 or 91 to be indicated at the associated output line 96 when a bit location is addressed. Of the eight array divisions shown in FIG. 5, FIG. 6 illustrates array one bits zero and one and array two bits zero and one of the first array division (or two-thirds of one array division). Adjoining each of the source lines 55 in the array are a pair of sense lines 90 and 91. The output of each sense line 90 is double inverted (inverters 107 and 108) by being connected to the gate of transistor 102 with the inverted output on line 103 connected to the gate of transistor 104 to provide the true output on line 105. The output on line 105 is applied to the gate of one of the transistors 99 of NOR 101. Each of the lines 105 (bus 98 in FIG. 5) is connected to the gate of one of the three transistors 99 which with transistor 100 function as a four way NOR circuit 101. Any of the transistors 99 associated with a non-selected source line will have a down level at the gate thereof. If upon selection of a source line 55 associated with bit zero and a gate line 33 a device is present at the addressed bit location 36, the source line 55 is coupled to the sense (drain) line 90 and a plus charge is applied to the gate of the associated transistor 102. The resulting output on line 105 is applied to NOR 101. The negative output or de-conditioning of NOR 101 is inverted by inverter 110 to a positive charge applied to the transistor of NOR 101, which forms a part of the output latch 111. Applying a plus charge to any of the transistors 99 causes NOR 101 to have a positive output on line 96. The positive charge on line 96 is applied to the gate of transistor 114 causing output terminal 113 to be grounded which is indicative of the presence of an up or binary one condition at the addressed bit location. The output on line 96 is also applied to the gate of transistor 100 to retain NOR 101 in the condition wherein a negative output or down condition is maintained on line 115. The output condition at terminal 113 is thereupon latched until reset. To reset all output terminals a down or negative charge is applied to the gate of transistor 116 of reset inverter 117. The resulting positive output on line 118 is applied to the gate of transistor 119 (and to the corresponding transistor of each of the other 15 output latches 120) causing line 96 to become negative thereby reseting latch 120 and restoring all 16 output terminals 113 to a non-grounded condition in preparation for a subsequent cycle.

Figure 4:
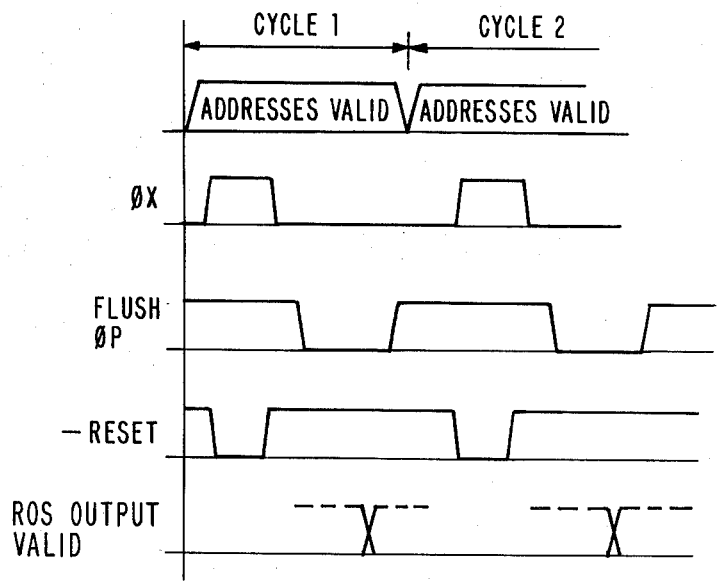
FIG. 4 is a timing chart showing the read only memory cycle including the associated clock pulses, reset and output timing.
Figure 6C:
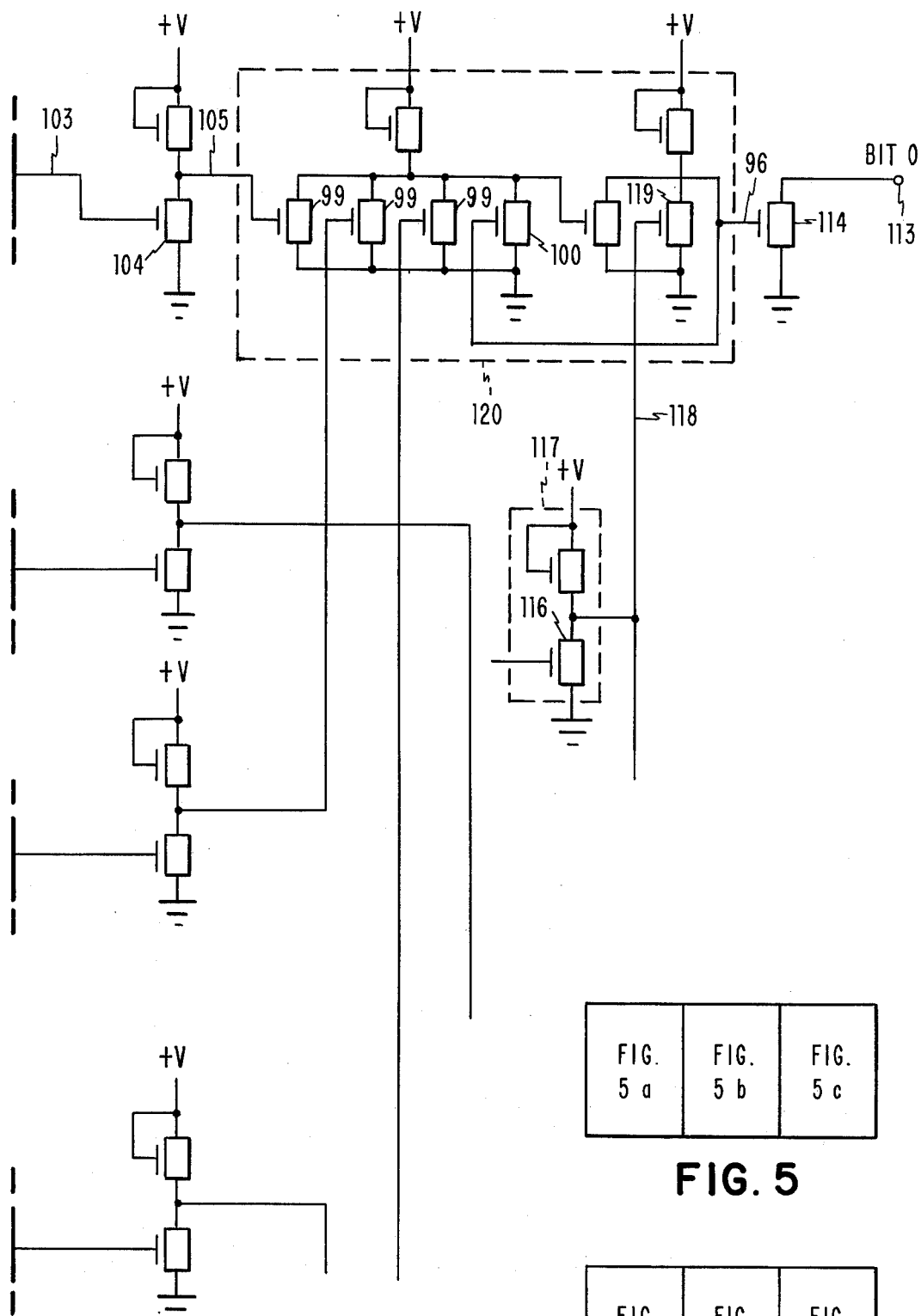
FIGS. 6A–6C when arranged from left to right as shown in FIG. 6 is a schematic cross-section of the circuitry of FIG. 5 showing representative address circuits, address decode circuits, array select and decode circuits, output sensing and latch circuits and an interrupted portion of the array including array one and array two portions of the first of eight divisions of the complete array shown in FIG. 5.

As seen in FIGS. 4–6, during a ROM cycle the read only store array is addressed by a seven bit decode address on lines 37, a five bit chip or array select address on lines 75 and a three bit source decode address on lines 56, 57 and 58. The outputs of the gate decode circuits 50 are pre-charged by the positive timing pulse $\phi$X. Since all of the gate decode circuits 50 except the one selected, will have one or more transistors 52 which form the NOR circuit conducting to ground, only the selected line will remain charged after the fall of $\phi$X. The selected line 33 remains charged until a new address which selects another gate line 33 provides a path to ground for the previously selected gate line. When the flush $\phi$P clock time falls to a minimum condition the source decode circuits 68 are no longer disabled and the source lines 55 selected by the three bit source decode address portion and five bit chip or array select address portion become energized. Thereupon, at those bit locations 36 addressed by the selected source and gate lines at which a gate or device is installed, an output charge is transferred to the sense line 90 or 91, is double inverted and transmitted through NOR 101 and inverter 110 to set the associated latch 120 and provide a grounded output at the associated output terminal 113 indicating a binary one condition at the addressed location. Flush $\phi$P then supplies a positive charge on line 94 to ground all sense lines 90 and 91 by providing a path to ground through the dummy array transistors 93, the associated source lines and source decode circuit transistor 122. Concurrently with the positive condition of flush $\phi$P, the input line to reset inverter 117 is driven to a minus value causing the output on line 118 to be positive and reset all 16 latches 120 in preparation for the succeeding cycle.

While the invention has been particularly shown and described with reference to a preferred embodiment thereof, it will be understood by those skilled in the art the various changes in form and details may be made therein without departing from the spirit and scope of the invention.

We claim:

1. A solid state read only memory unit comprising a plurality of bit locations arranged in rows and columns with each bit location having first and second output electrodes and a gate position, said bit location being capable of transistor action between said first and second electrodes when a gate is installed at said gate position, said bit location upon being addressed by charging the first output electrode and said gate position indicating a first logic level at said second output electrode row of said bit locations, a plurality of first address circuits and first decoding means for selecting at least one source line in accordance with the input received from said first address circuits;

second address means including a series of gate connecting lines each connected to gates installed in a column of bit locations, a plurality of second address circuits and a second decoding means interconnected with said second address circuits and said gate connecting lines for selecting one of said gate connecting lines in accordance with the input received from said second address circuits;

sense means including a plurality of sense lines each connected to a row of bit location second output electrodes; and switch means selectively operable to connect all sense lines to a common potential.

13. A solid state read only memory unit comprising, a plurality of bit locations arranged as a matrix of rows and columns of field effect transistor (FET) devices wherein a first logic level is indicated when a gate connection is present and a second logic level is indicated when a gate connection is absent and wherein each FET device includes first and second electrodes connected to the source and drain thereof and a gate which may enable transistor action when a gate connection is present;

first addressing means for connecting said first electrodes of a selected row of said FET devices to a means for inducing a potential difference between said first and second electrodes;

second addressing means for imparting a charge to the gate connectors of a selected column of said FET devices;

sensing means connected to said second output electrodes of said selected row and including circuit means for precluding flow of direct current at said second output electrodes whereby the logic level of the bit location at the intersection of said selected row and said selected column is determined by the presence or absence of a charge transferred between said first electrode and said second electrode resulting from the presence or absence of a gate connector at such bit location.

* * * * *